(12) United States Patent
Chen et al.

(10) Patent No.: US 9,262,579 B2
(45) Date of Patent: Feb. 16, 2016

(54) INTEGRATION OF LITHOGRAPHY APPARATUS AND MASK OPTIMIZATION PROCESS WITH MULTIPLE PATTERNING PROCESS

(71) Applicant: ASML NETHERLANDS B.V., Veldhoven (NL)

(72) Inventors: Luoqi Chen, Saratoga, CA (US); Jun Ye, Palo Alto, CA (US); Hong Chen, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/468,635

(22) Filed: Aug. 26, 2014

(65) Prior Publication Data

US 2014/0365983 A1  Dec. 11, 2014

Related U.S. Application Data

(63) Continuation of application No. 13/349,692, filed on Apr. 4, 2012, now Pat. No. 8,819,601.

(60) Provisional application No. 61/471,652, filed on Apr. 4, 2011.

(51) Int. Cl.
  *G06F 17/50* (2006.01)
  *G03F 1/70* (2012.01)
  *G03F 7/20* (2006.01)

(52) U.S. Cl.
  CPC .............. *G06F 17/5081* (2013.01); *G03F 1/70* (2013.01); *G03F 7/705* (2013.01); *G03F 7/70433* (2013.01); *G03F 7/70466* (2013.01); *G03F 7/70508* (2013.01); *G03F 7/707* (2013.01)

(58) Field of Classification Search
  USPC .......................................................... 716/53
  See application file for complete search history.

(56) References Cited

U.S. PATENT DOCUMENTS

| 7,800,733 | B2 * | 9/2010 | Op de Beeck | 355/67 |
|---|---|---|---|---|
| 7,864,301 | B2 | 1/2011 | Socha | |
| 8,111,921 | B2 | 2/2012 | Hsu et al. | |
| 8,356,261 | B1 | 1/2013 | Socha | |
| 8,438,508 | B2 | 5/2013 | Liu | |
| 8,495,528 | B2 | 7/2013 | Bagheri et al. | |

(Continued)

FOREIGN PATENT DOCUMENTS

| CN | 101840163 | 9/2010 |
|---|---|---|
| CN | 102054092 | 5/2011 |

(Continued)

*Primary Examiner* — Annette M Thompson
(74) *Attorney, Agent, or Firm* — Pillsbury Winthrop Shaw Pittman LLP

(57) ABSTRACT

The present invention relates to lithographic apparatuses and processes, and more particularly to multiple patterning lithography for printing target patterns beyond the limits of resolution of the lithographic apparatus. A method of splitting a pattern to be imaged onto a substrate via a lithographic process into a plurality of sub-patterns is disclosed, wherein the method comprises a splitting step being configured to be aware of requirements of a co-optimization between at least one of the sub-patterns and an optical setting of the lithography apparatus used for the lithographic process. Device characteristic optimization techniques, including intelligent pattern selection based on diffraction signature analysis, may be integrated into the multiple patterning process flow.

21 Claims, 11 Drawing Sheets

(56) References Cited

U.S. PATENT DOCUMENTS

| | | |
|---|---|---|
| 8,543,947 B2 * | 9/2013 | Liu et al. .................. 716/55 |
| 8,572,522 B2 | 10/2013 | Iwase et al. |
| 2006/0085773 A1 | 4/2006 | Zhang |
| 2007/0018286 A1 | 1/2007 | Chen |
| 2007/0050749 A1 | 3/2007 | Ye et al. |
| 2008/0069432 A1 | 3/2008 | Hsu et al. |
| 2009/0053621 A1 | 2/2009 | Socha |
| 2009/0217224 A1 | 8/2009 | Wiaux et al. |
| 2011/0083113 A1 | 4/2011 | Ye et al. |
| 2011/0099526 A1 | 4/2011 | Liu |
| 2011/0107280 A1 * | 5/2011 | Liu et al. .................. 716/53 |
| 2012/0040280 A1 | 2/2012 | Agarwal et al. |
| 2012/0077130 A1 | 3/2012 | Bagheri et al. |
| 2012/0113404 A1 * | 5/2012 | Hsu et al. .................. 355/67 |
| 2012/0124529 A1 | 5/2012 | Feng et al. |
| 2013/0074017 A1 | 3/2013 | Iwase et al. |
| 2013/0179847 A1 | 7/2013 | Hansen |
| 2013/0212543 A1 | 8/2013 | Crouse et al. |
| 2013/0311958 A1 | 11/2013 | Liu |
| 2013/0326437 A1 | 12/2013 | Liu et al. |

FOREIGN PATENT DOCUMENTS

| | | |
|---|---|---|
| JP | 2008-096991 | 4/2008 |
| JP | 2009-200499 | 9/2009 |
| KR | 1020070009481 | 1/2007 |

* cited by examiner

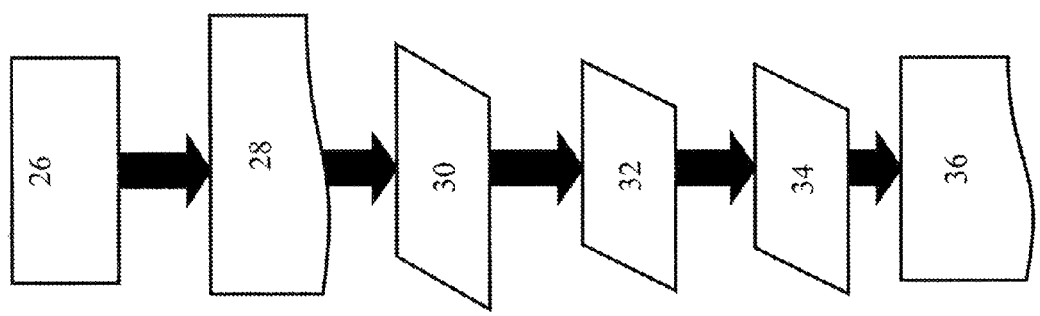

INTEGRATION OF LITHOGRAPHY APPARATUS AND MASK OPTIMIZATION PROCESS WITH MULTIPLE PATTERNING PROCESS

CROSS-REFERENCE TO RELATED APPLICATIONS

This application is a Continuation of U.S. patent application Ser. No. 13/439,692, filed Apr. 4, 2012, now U.S. Pat. No. 8,819,601, which claims priority to U.S. Provisional Application No. 61/471,652, filed Apr. 4, 2011, the contents of each of which are incorporated by reference herein in their entireties.

FIELD OF INVENTION

The technical field of the present invention relates generally to simulation of a lithography process, and more specifically to optimizing characteristics of a lithography apparatus and design layout through simulation to achieve better imaging performance.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

Double patterning (DP) lithography is one of the methods to effectively overcome the resolution limit of lithographic exposure apparatus, especially, when further increase of NA is no longer a feasible option to enhance printing quality of the critical/non-critical features in a 'feature-dense' layout. In general, in double patterning lithography, dense patterns, whose individual feature CD and/or inter-feature pitch is below the resolution limit of the lithography apparatus, are split in two parts (this process is referred to as "coloring"), such that, independently in each part, there is no resolution-related problems to overcome during pattern printing. The parts are patterned sequentially, interspersing features printed in the first lithography with features printed in the second lithography, to reproduce the entire pattern.

The existing splitting framework, specially for full-chip double patterning, may use a rule-based splitting algorithm followed by stitching and/or OPC(Optical Proximity Correction). The rule-based splitting algorithm splits the design layout into two sub-layouts based on a set of rules according to imaging system limitations. Then the stitching and/or OPC algorithm is applied independently for each sub-layout.

Source mask optimization (SMO) is a process to optimize source and mask (i.e. design layout) simultaneously to achieve the better resolution and/or processing window (PW) for a given design layout. Reduction of total runtime of SMO can be achieved if the design layout of the mask is optimized with respect to the source. In general, to lower the computation cost and time, a critical set of design patterns is either provided by users or automatically selected by an intelligent algorithm. SMO is performed only on the selected critical design set of design patterns to get the optimized source. Then, optionally, the full chip mask optimization (FMO) is used to optimize the full chip design layout given the optimized source. A lithography manufacturability check (LMC) may also be optionally done to add the hotspots into selected critical design pattern set.

Thus far, SMO and DP have not been integrated to achieve even better imaging performance in a more computationally efficient way. Therefore, there exists a need for integrating SMO and DP in a unified process flow. Furthermore, there exists a need to co-optimize the design layout for other optical characteristics, such as the projection optics in a lithography apparatus.

SUMMARY OF THE INVENTION

The present invention provides a number of innovations in the area of device characteristics optimization in the context of multiple patterning lithography and other lithographic applications, that address the requirements mentioned above, among others.

In an embodiment of the present invention, a method of splitting a pattern to be imaged onto a substrate via a lithographic process into a plurality of sub-patterns is disclosed, wherein the method comprises a splitting step being configured to be aware of requirements of a co-optimization between at least one of the sub-patterns and an optical setting of the lithography apparatus used for the lithographic process.

In another embodiment of the present invention, a pattern selection method is used to select a representative smaller set of portions of a design layout containing the patterns from a relatively larger set, wherein the representative smaller set adequately covers characteristic pattern features of the relatively larger set, such that the co-optimization process is expedited.

These and other aspects of the present invention, including systems and computer program products corresponding to the above methods, will be apparent to a person skilled in the art in view of the following drawings and detailed description.

BRIEF DESCRIPTION OF THE DRAWINGS

The above and other aspects and features of the present invention will become apparent to those ordinarily skilled in the art upon review of the following description of specific embodiments of the invention in conjunction with the accompanying figures, wherein:

FIG. 2 is a block diagram of simulation models corresponding to the subsystems in FIG. 1;

DETAILED DESCRIPTION OF THE EXAMPLE EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
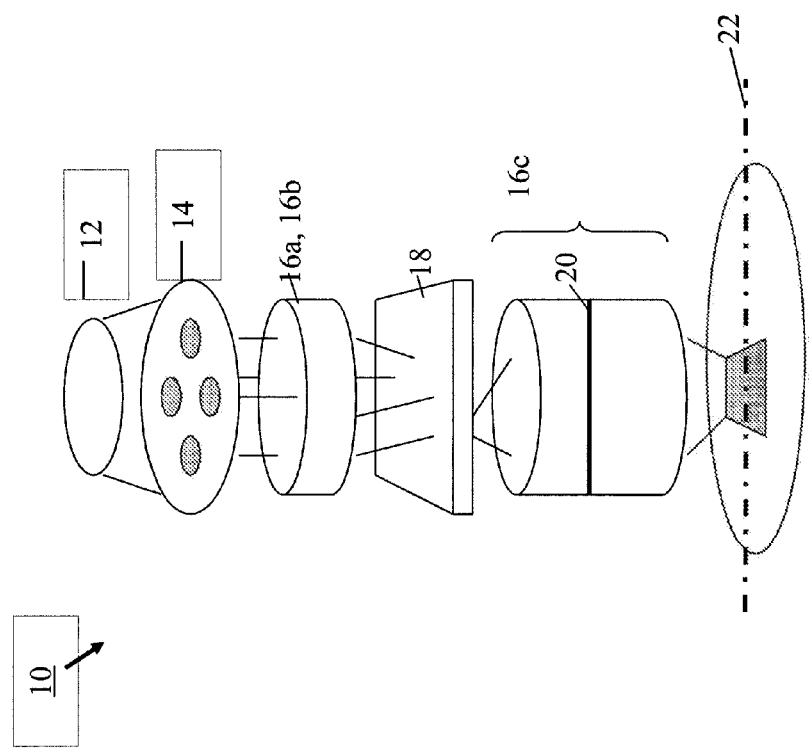
FIG. 1 is a block diagram of various subsystems of a lithography system according to example implementations of the present invention.

A. General Environment in a Lithography System for Implementing Example Embodiments of the Present Invention Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA = \sin(\Theta_{max})$.

In a lithography simulation system, these major system components can be described by separate functional modules, for example, as illustrated in FIG. 2. Referring to FIG. 2, the functional modules include the design layout module 26, which defines the target design layout; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape, where $\sigma$ (or sigma) is outer radial extent of the illuminator. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS. Those skilled in the art will understand that the input file format is irrelevant.

B. Example Methods of the Present Invention

As mentioned in the summary section, in the present application, a method of splitting a pattern to be imaged onto a substrate via a lithographic process into a plurality of sub-patterns is disclosed. The method comprises a splitting step being configured to be 'aware' of requirements of a co-optimization between at least one of the sub-patterns and an optical setting of the lithography apparatus used for the lithographic process. The splitting step is configured to predict an image quality after co-optimization. The image quality may be predicted by analyzing the compatibility of sub-patterns. For example, some patterns can not be optimally imaged well together, so they need to be accommodated in different split layouts. The sub-patterns are usually sequentially imaged on the substrate while being combined on a single layer of the substrate.

The optical setting of the lithography apparatus may include one or more of: setting and characteristics of an illumination source; setting and characteristics of a projection optics system; and, combined setting and characteristics of an illumination source and a projection optics system. Non-limiting examples of illumination source characteristics are: laser wavelength, laser bandwidth, source intensity profile, source polarization etc. Similarly, non-limiting examples of projection optics characteristics are: numerical aperture (NA), apodization, aberration/wavefront modulation, lens heating, birefringence, dispersion, flare etc.

The splitting step may comprise rule-based splitting, algorithm based splitting, or a combination of rule-based and algorithm-based splitting. The splitting and co-optimization may be performed sequentially, in parallel, alternatively, or iteratively.

The co-optimization-aware splitting step may use diffraction signature analysis to select the plurality of sub-patterns from a set of possible sub-patterns into which the pattern can be split, such that the desired imaging result is obtained. This is typically done in frequency domain.

Diffraction-signature analysis is not the only method to select the plurality of sub-patterns. For example, in an alternative embodiment, the co-optimization-aware splitting step may use two-dimensional pattern clustering in spatial domain to select the plurality of sub-patterns from a set of possible sub-patterns into which the pattern can be split, such that the desired imaging result is obtained. Two-dimensional pattern clustering in spatial domain indicates grouping 1D/2D patterns based on similarity using spatial domain characteristics (as opposed to frequency domain characteristics used in typical diffraction signature analysis). One example is to use pitch and width information to group line/space (L/S) patterns. Another example is to use local geometry of a pattern to classify it as a pitch pattern or a line-end or a slot-end or a Z-shape etc. One can subsequently use these classifications to perform a split. For example, for L/S patterns the split may be done equally for a certain pitch range, or patterns in another pitch range may be clustered all to a particular layer. These illustrative examples are not limiting to the scope of the present invention.

In yet another alternative embodiment, the co-optimization-aware splitting step may use one or both of frequency information and local spatial information of the pattern to select the plurality of sub-patterns from a set of possible sub-patterns into which the pattern can be split, such that the desired imaging result is obtained. For example, first local spatial characteristics may be used to classify patterns into coarse categories, and then diffraction signature analysis (which uses frequency domain information) within each category. Persons skilled in the art will understand that the reverse may also be used, i.e., first frequency domain information is used for coarse categorization, and then spatial domain analysis is used to fine-tune the split method.

Figure 3A:
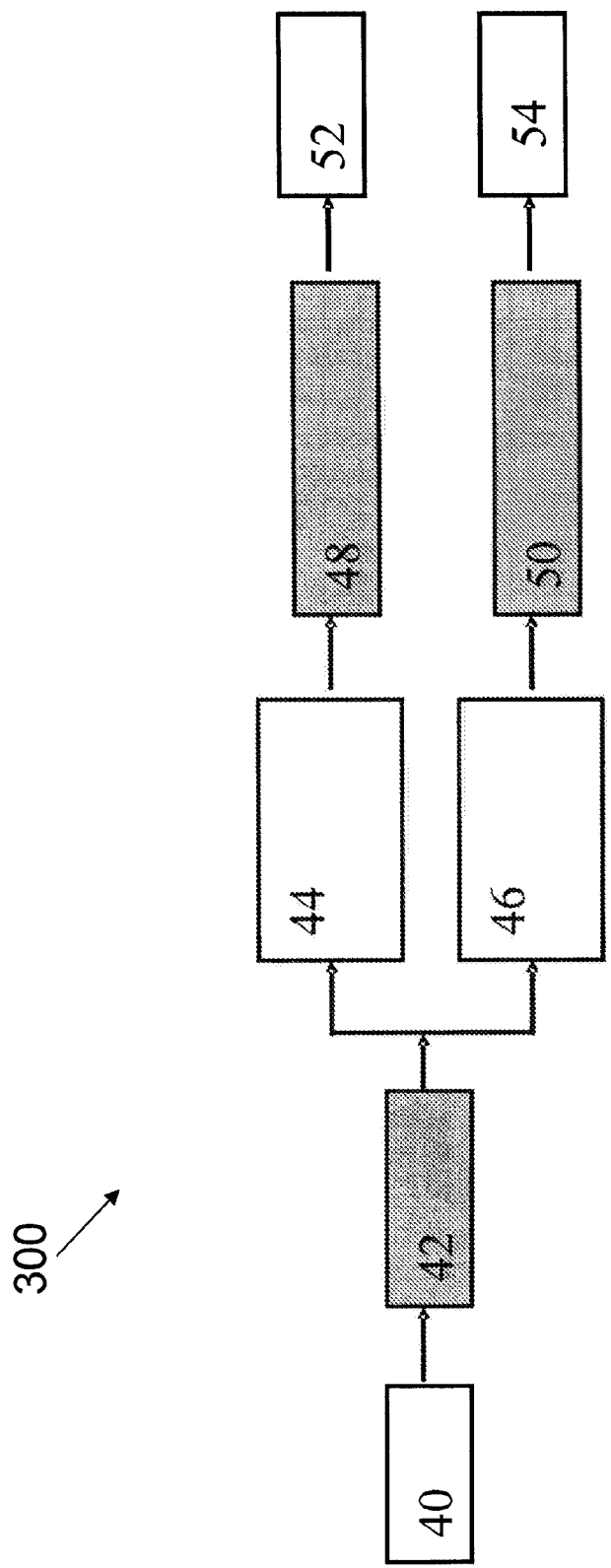
FIG. 3A is a flow diagram illustrating conventional double patterning lithography process flow.
Figure 3B:
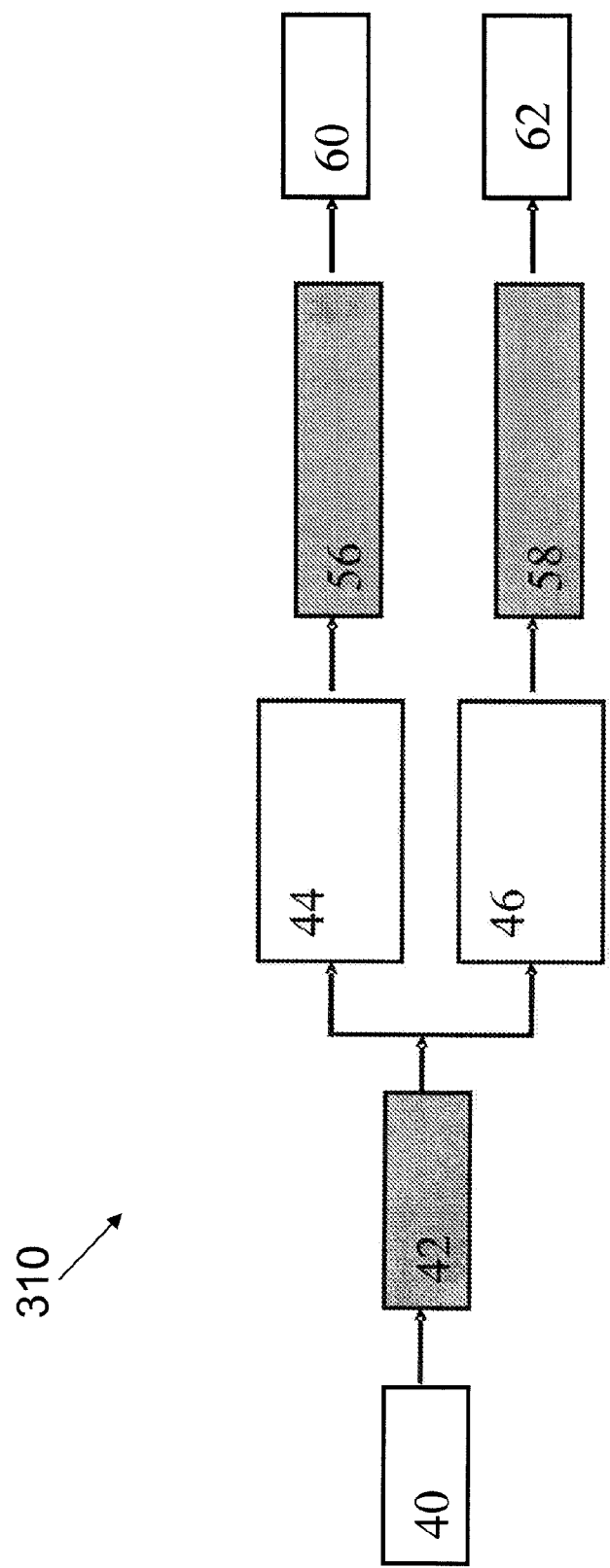
FIG. 3B is a flow diagram illustrating unidirectional integration of double patterning and SMO, according to an embodiment of the present invention.

FIG. 3A shows a conventional full-chip double patterning lithography simulation process flow 300, where the double patterning split algorithm does not necessarily accommodate any device/mask optimization, as opposed to the process flow 310 discussed in FIG. 3B. It is noted that, though in most of the examples discussed in the specification, a target pattern layout is decomposed into two sub-layouts only, the scope of the invention is not limited by the number of sub-layouts. Hence, the term "double patterning," encompasses multiple patterning methods as well, where more than two sub-layouts are involved. Also, in the process flow illustrations, the gray blocks indicate application of a method/algorithm, and the clear blocks indicate input/output of the methods/algorithms. Also, the terms "layout" and "sub-layout" may mean arrangement of certain patterns of interest from a larger arrangement of patterns that include the patterns of interest. A plurality of sub-layouts may be combined in suitable arrangement in order to reconstruct a larger sub-layout (such as a full-chip sub-layout), which is one of the splits of a larger design layout (such as a full-chip design layout).

In the flow 300, a design layout 40 is split into two sub-layouts, 44 and 46, by applying conventional split algorithm 42. Stitching/OPC algorithm 48 and 50 are applied independently to each of the sub-layouts 44 and 46, respectively. Post-OPC design sub-layouts 52 and 54 are then generated as design precursors to manufacture actual physical reticles.

FIG. 3B shows one embodiment according to the present invention, where SMO is integrated in the DP lithography simulation process flow 310 in a unidirectional way, i.e. both DP split algorithm and SMO are part of the process flow in a successive manner. The DP split algorithm 42 is not necessarily dynamically modified based on the SMO process. In blocks 56 and 58, instead of conventional stitching/OPC algorithm, a stitching/SMO algorithm is applied to sub-layouts 44 and 46. Post-SMO design sub-layouts 60 and 62 are then generated as design precursors to manufacture actual physical reticles. Sub-layouts 60 and 62 also have respective optimized sources associated with them. Though not shown specifically in FIG. 3B, further OPC may be done to sub-layouts even after SMO adjustment.

As described before, source mask optimization (SMO) is a process to optimize source and mask (i.e. design layout) simultaneously to achieve the better resolution and/or processing window (PW) for a given design layout, which may or may not be split into sub-layouts, depending on the lithography process adopted. Similarly, lens mask optimization (LMO) is a process to optimize lens and mask (i.e. design layout) simultaneously. Here, the term "lens" broadly encompasses all optical components that transmit, shape and direct light from the illumination source to the wafer. "Lens" includes projection optics components. Though in the example embodiments, mostly SMO is discussed for illustrative purposes, the scope of the invention encompasses integration of DP with SMO, LMO, and even SMLO (combined source mask lens optimization). A key object of the invention is the integration of DP and SMO/LMO/SMLO in a unified process flow to simulate the imaging performance of a lithography apparatus. Intelligent pattern selection increases the efficiency of the SMO/LMO/SMLO process. The DP split algorithm accommodates the intelligent pattern selection, as will be discussed later.

In general, a SMO/LMO/SMLO methods aim to achieve full chip pattern coverage while lowering the computation cost by intelligently selecting a small set of critical design patterns from the full set of clips to be used in the optimization process. SMO/LMO/SMLO is performed only on these selected patterns to obtain an optimized source and/or lens. The optimized source and/or lens is then used to optimize the mask (e.g. using OPC and LMC) for the full chip, and the results are compared. If the results are comparable to conventional full-chip SMO/LMO/SMLO, the process ends, otherwise various methods are provided for iteratively or otherwise converging on the successful result.

Embodiments of the present invention use selection of a smaller representative set of target patterns from a larger set of target patterns, wherein the representative set of target patterns adequately represent at least all the critical features of the full design layout. Co-pending co-owned patent application Ser. No. 12/914,954 by Liu et al., titled, "Selection of Optimum Patterns in a Design Layout Based on Diffraction Signature Analysis," filed on Oct. 28, 2010, published as US 2011/0107280, provides diffraction-based pattern grouping and optimization methods that can be applied to both source and mask configurations. The '954 application is incorporated herein in its entirety by reference. The larger set of target patterns may comprise the entire design layout of a mask, or a substantially large portion of the design layout. Although the embodiments of the present invention is particularly suited to SMO/LMO/SMLO, persons skilled in the art will understand that the pattern selection algorithms are universally applicable to any situation where a bigger design layout needs to be represented adequately by intelligently selected smaller set of target patterns from the design layout.

A representative set of target patterns may comprise user-selected clips picked manually, and/or pattern-selection algorithm-selected clips picked automatically. For example, an anchor clip, which is usually the clip that has known highest (or nearly highest) density of line/space features, may be manually selected by the user to always be part of the representative set. Anchor clip also may contain features of known particular importance.

The representative set of target patterns may be used to optimize an illumination source used in the lithographic process. Optimizing the illumination source may include tuning polarization distribution of a radiation beam incident on a mask. The representative set of target patterns may also be used to optimize a projection optics system used in the lithographic process (as described before, the term 'lens' encompasses projection optics system). Optimizing the projection optics system may include manipulating a wavefront of the radiation beam in a pupil plane (or any other selected plane) after the radiation beam passes through the mask. Co-optimization of the design layout and the optical characteristics (i.e. illumination source and/or projection optics characteristics) is encompassed by the scope of the present invention.

A target design layout (typically comprising a layout in a standard digital format such as OASIS, GDSII, etc.) for which a lithographic process is to be optimized may include memory, test patterns, logic circuitry etc. From this design layout, the initial larger set of target patterns (clips) is identified. In a specific embodiment of the invention, a full set of clips is extracted, which represents all the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed.

The initial larger set of clips may be provided a priori by a customer based on known critical feature areas in a design layout which require particular image optimization. Alternatively, in another embodiment of the present invention, the initial larger set of clips may be extracted from the entire design layout by using some kind of automated (such as, machine vision) or manual algorithm that identifies the critical feature areas.

The larger set of patterns may, for example, comprise different pattern types, such as gate or logic patterns, or may, for example, comprise patterns having a specific orientation. The larger set of patterns may, for example, also comprise patterns comprising a certain level of complexity or patterns requiring particular attention and/or verification during the lithographic processing, for example, specific test structures complying to design rules, like 1D/2D through pitch, staggered through pitch, commonly used design constructs or primitives (e.g., elbows, T shapes, H shapes), repeatedly used layout structures like memory cells (e.g., brick walls), memory periphery structures (e.g., hooks to memory cells), and patterns with known imaging issues from previous generation, etc. The larger set of patterns may, for example, further comprise patterns having a predefined process window performance or, for example, comprise patterns comprising a sensitivity to process parameter variations of the pattern.

A small subset of patterns or clips (e.g. 15 to 50 clips, although any number can be used) is selected from the initial larger set of clips. The selection of the subset of patterns or clips is preferably performed such that the process window of the selected patterns as closely as possible matches the process window for the larger set of critical patterns. The effectiveness of the selection is also measured by the total turnaround time or run time reduction in the combined pattern-selection and subsequent SMO/LMO/SMLO process.

As disclosed in the co-pending '954 application, in one example aspect of the present invention, a diffraction-based method of selecting a subset of target patterns from a design layout is disclosed, where the method comprises the following steps: generating a respective diffraction map for each of a plurality of target patterns from an initial larger set of target patterns from the design layout; identifying diffraction signatures from the various diffraction maps of the plurality of target patterns from the initial larger set of target patterns; grouping the plurality of target patterns from the initial larger set of target patterns into diffraction-signature groups, the target patterns in a specific diffraction-signature group having similar diffraction signature; and selecting the subset of target patterns to cover a predefined part of the diffraction-signature groups, such that the subset of target patterns represents at least a part of the design layout for the lithographic process. The grouping of the plurality of target patterns may be governed by predefined rules based on similarity of diffraction signature. The predefined rules comprise coverage relationships existing between the various diffraction-signature groups.

In a specific diffraction-based pattern selection example, a method of selecting a representative set of target patterns in a design layout is disclosed, the method comprising the steps of: generating a respective diffraction map for each of an initial larger set of target patterns in the design layout; identifying peaks in each of the diffraction maps; storing one or more characteristic parameters of the identified peaks in each of the diffraction maps; analyzing the stored characteristic parameters of the identified peaks to create a list of diffraction-signature groups, each diffraction-signature group having one or more respective basis vectors; inspecting coverage relationships existing between the various diffraction-signature groups from the various diffraction maps of the initial larger set of target patterns, wherein the coverage relationships are governed by predefined rules; identifying a final subset of target patterns whose diffraction-signature groups adequately cover all possible diffraction-signature groups from all the diffraction maps; and, selecting the final subset of target patterns to be included in the representative set of target patterns, such that the final subset of target patterns represents at least a part of the design layout for the lithographic process.

Figure 4:
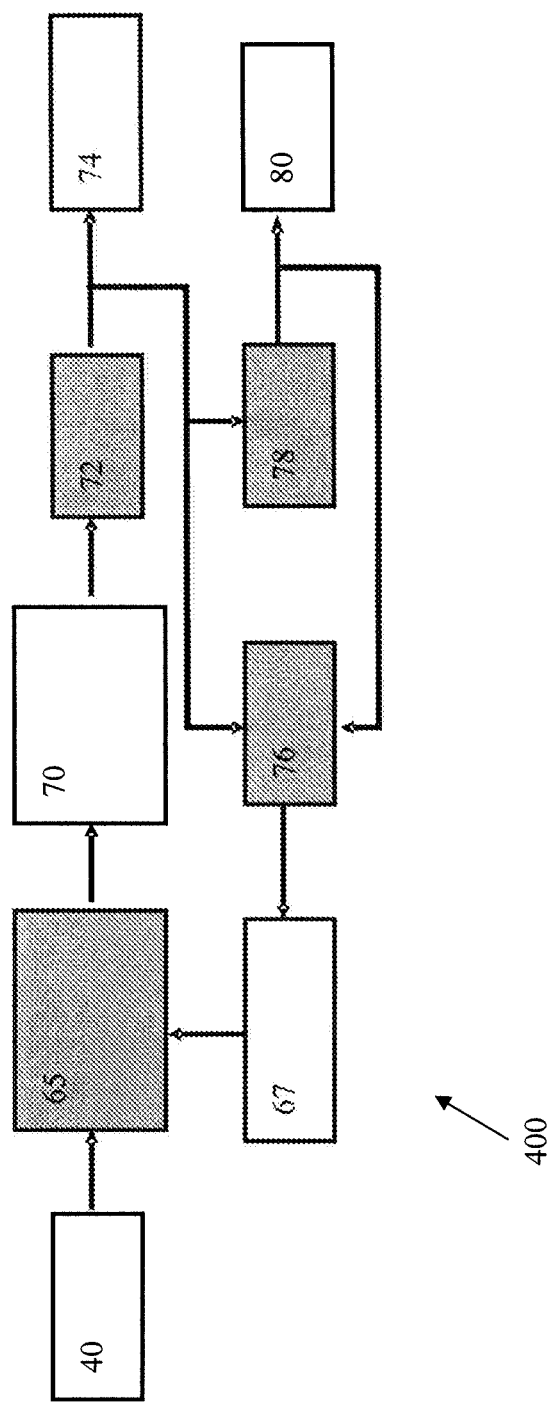
FIG. 4 shows integration of intelligent pattern selection in SMO, according to an embodiment of the present invention.

FIG. 4 shows one example of how intelligent pattern selection is accommodated conventionally in a full-chip SMO process flow 400. Note here the design layout 40 is not split into sub-layouts, as shown in FIGS. 3A-3B, but persons skilled in the art will understand that the conventional process flow 400 can be modified for multiple patterning lithography as well when teaching of the present application are applied suitably.

In FIG. 4, block 65 indicates application the pattern selection method on the design layout 40, or the larger set of target patterns, as discussed above. As a result, a representative set of target patterns 70 (which are also called 'portions of design layout') is identified. The set 70 is the basis of the SMO process, indicated in block 72. An optimized source 74 is obtained as a result of the SMO method in 72. Based on the optimized source 74, a full-chip optimization (FMO) process is executed, as shown in block 78. A resulting full-chip mask or design layout 80 is obtained. An iterative framework may be adopted to ensure full chip coverage, and also to ensure design for manufacture. The LMC process in block 76 take optimized source information and mask information as inputs, and verifies whether hot spots or warm spots remain in the design layout 40. If hot spots/warm spots 67 are identified, then they are included in the representative set of patterns, and optionally, the method/algorithm of block 65 is run again to even better optimize the source and the design layout.

One of the problems for the above described flows in FIGS. 3A, 3B and 4 is the absence of the source knowledge (or knowledge about other optical characteristics of the lithography apparatus) in the DP split algorithm and/or the pattern-selection algorithm. Here only SMO is being discussed for non-limiting illustration.

It has been seen from experience that the SMO process is substantially dependent on the sub-layouts resulting from the DP split process. In a DP split step, a target pattern may have several possible split choices. If different optimum source configurations are necessary for different split choices, then the overall SMO process becomes inefficient. To achieve an acceptable global optimal solution, the DP split should preferably select a solution which achieves the optimal (or desirable) SMO result. Another drawback is that the stitching/OPC/SMO processes for each split sub-layout is independent of the other sub-layouts in the embodiments shown in FIGS. 3A, 3B, and 4. Therefore there is no or little flexibility to adjust the cut line position which is determined in the DP split step. Thus, tighter integration of the DP split and SMO algorithms may be advantageous for improved flexibility in simulating imaging performance, as shown in FIGS. 5 and 6.

Figure 5:
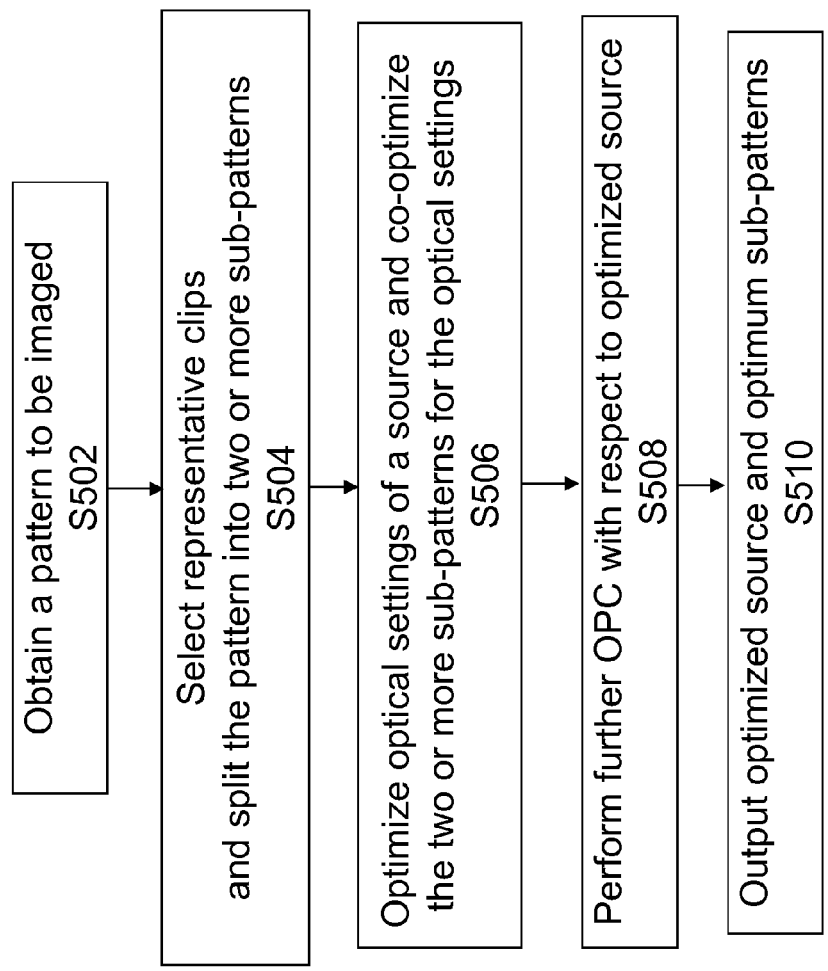
FIG. 5 is a flowchart illustrating an example method of integrating various aspects of the present invention.
Figure 6:
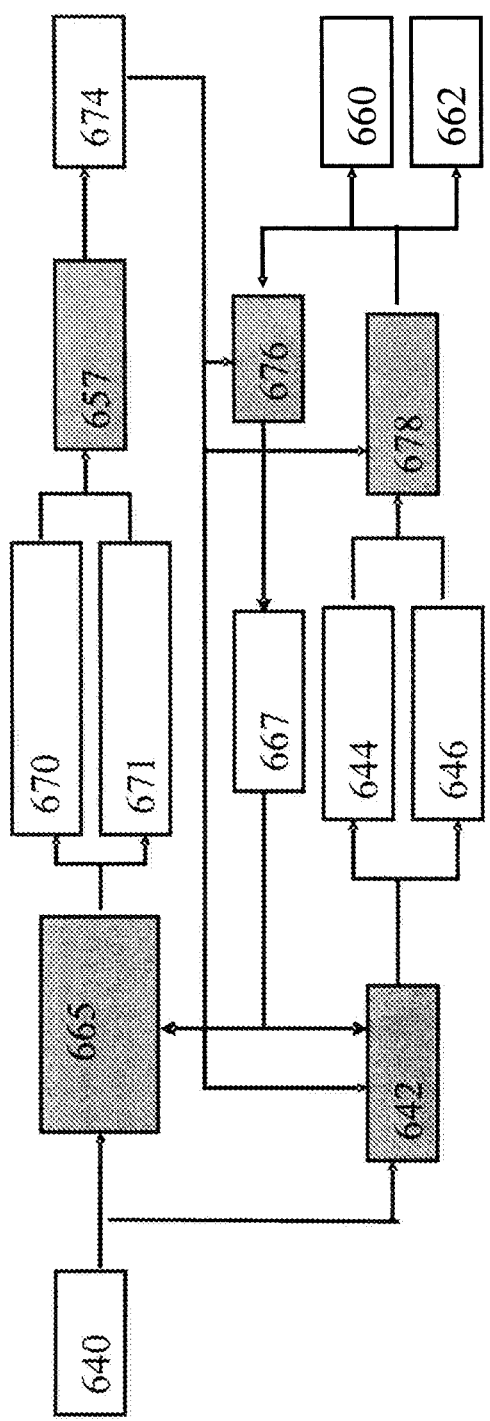
FIG. 6 illustrates integration of design layout splitting, pattern selection and device optimization, according to an example embodiment of the present invention.

FIG. 5 discusses one example embodiment an integrated DP-SMO-pattern selection process.

In step S502, a design layout (or a larger set of clips) is obtained.

In step S504, a diffraction-signature-analysis based algorithm (referred to as DP-Pattern selection algorithm) is used to select a representative smaller set of clips (or portions of design layout) and split them into two sub-layouts simultaneously.

In step S506, a combined DP-SMO algorithm optimizes the split sub-layouts and the source simultaneously.

In step S508, further OPC is performed with respect to the optimized source of step S508. This step is optional.

In step S510, the results are outputted, i.e. an optimized source and the selected optimum sub-layouts for the design layout are generated. It is useful for process window analysis in the design phase.

FIG. 6 shows one example embodiment where the DP-split algorithm 642, DP-Pattern selection algorithm 665 (step S504 in FIG. 5) and the DP-SMO algorithm 657 (step S508 in FIG. 5) are integrated by a progressive scheme. The DP-pattern selection algorithm 665 takes the design layout (or larger set of clips) 640, and uses a SMO-aware algorithm to select a subset of critical patterns and split them into two sub-layouts 670 and 671. DP-SMO algorithm 657 optimizes the two sub-layouts 670 and 671 and the source simultaneously, to output an optimized source 674. DP-Split algorithm 642 uses rules that are known a priori and/or which are determined by the source 674, once it is optimized during the current process. DP-OPC algorithm 678 (equivalent to FMO described in FIG. 4) optimizes two full-chip sub-layouts 660 and 662 for the optimized source 674 by applying suitable OPC. Optional LMC algorithm 676 may identify hot spots/warm spots 667, which may be fed back to one or both of DP-Split algorithm 642 and DP-Pattern selection algorithm 665.

In an alternative embodiment, DP-Split algorithm 642 may not use the DP-pattern-selection algorithm 665, i.e. blocks 665, 670, 671, and 657 are not used in this alternative embodiment. In this embodiment, a known initial source 674 is used, and the algorithm 642 splits the design layout 640 into two sub-layouts 644 and 646, which may be optimized with source 674, followed by optional DP-OPC algorithm for FMO. Optional LMC step 676 may also be part of this embodiment.

Below we discuss specific examples of various features of the present invention. Persons skilled in the art will appreciate that not all of the features are required to implement each embodiment, and many of the features discussed separately below may be combined without diverting from the scope of the invention.

1. SMO-Aware DP-Pattern Selection

From the full design layout, an initial large set of clips is identified. Generally, it is assumed that the initial set includes desired critical patterns which can represent the whole design layout adequately. The initial large set of clips may be provided by a customer based on known critical feature area in a design layout which requires particular image optimization. Alternatively, it may also be extracted from the entire design layout automatically. For example, the critical feature areas under the DP Split rules can be used as the critical clip set.

Figure 7:
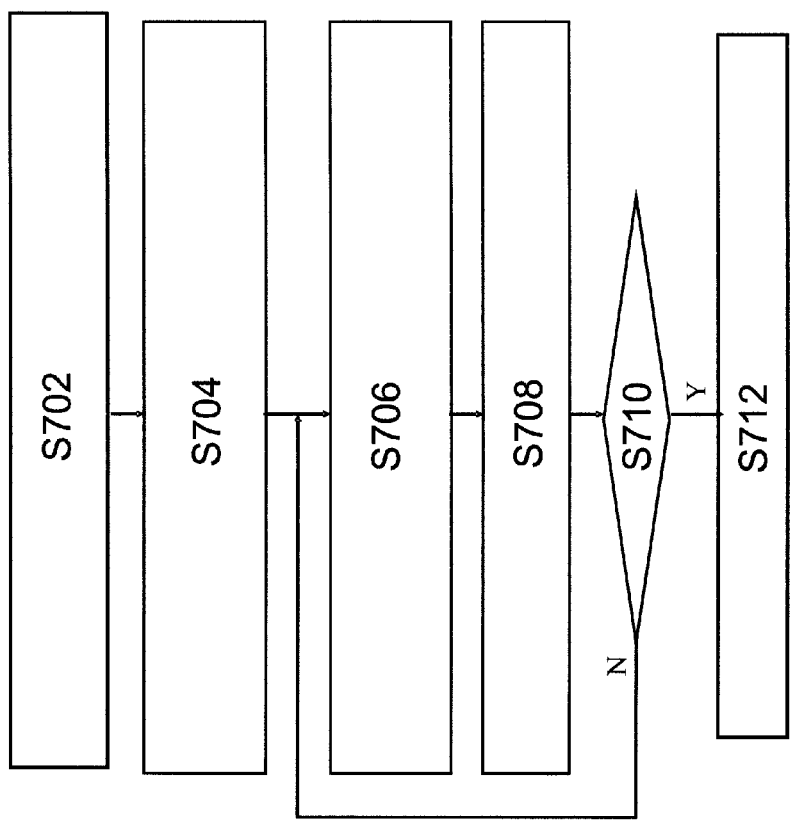
FIG. 7 is a flowchart illustrating an example method of pattern selection, according to an embodiment of the present invention.

A DP-pattern selection algorithm flowchart is shown in FIG. 7. In step S702 of the flowchart, the DP-pattern selection uses the diffraction-map-aware algorithm to split each target pattern in the larger set of clips. It is based on the knowledge how the diffraction-map is relevant to optimized source for a particular pattern. The less the number of diffraction-signature groups from the target pattern, the less constraints for the optimized source which lead to easier optimization with other patterns. For each target pattern, there may be multiple possible split choices. For each possible split choices, the diffraction-maps of split sub-layouts are generated. In one embodiment, the number of the diffraction-signature groups in two sub-layouts is used as the cost function which denotes how the SMO may prefer the particular split. Other types of cost functions may be predefined too.

In step S704, a selected clip set is initialized as an empty set, which is to be gradually populated as the representative clips are identified and added to the set. At the beginning of the next step S704, all clips are already split into two sub-layouts. Note that each clip still has two possible configurations. Let's denote the two sub-layouts of a clip $C_i$, as $M^0_i$ and $M^1_i$. The two sub-layouts can be swapped. There is a configuration variable $r_i$ to control the swapping. Each sub-layout has a list of diffraction-signature groups 'g' associated with it, where 'G' is a collection of groups 'g'.

$$(C_i, r_i) = (G_i^0, G_i^1)$$

$$= \begin{cases} (\{g_{i0}^0, g_{i1}^0, g_{i2}^0, \ldots\}, \{g_{i0}^1, g_{i1}^1, g_{i2}^1, \ldots\}) & r_i = 0 \\ (\{g_{i0}^1, g_{i1}^1, g_{i2}^1, \ldots\}, \{g_{i0}^0, g_{i1}^0, g_{i2}^0, \ldots\}) & r_i = 1 \end{cases}$$

In step S706, an iterative algorithm is used to determine the configuration of each clip to explore the coverage relationships. In each iterative step, the clip which has the maximal diffraction-signature group coverage number is selected and added to the selected clip set.

For two clips with their configuration $(C_i, r_i)$ and $(C_j, r_j)$, the diffraction-signature group cover number $N(C_i, r_i, C_j, r_j)$ can be calculated by the number of diffraction-signature groups which belong to $G_j^0$ and covered by a group in $G_i^0$ and plus the number of groups which belong to $G_j^1$ and covered by a group in $G_i^1$.

$$N((C_i, r_i), (C_j, r_j), \Omega) = |\{g_j^0 : g_j^0 \in G_j^0, g_j^0 \subset G_i^0, g_j^0 \notin \Omega\}| + |\{g_j^1 : g_j^1 \in G_j^1, g_j^1 \subset G_i^1, g_j^1 \notin \Omega\}|$$

Here $g_j^0 \subset G_i^0$ denotes that group $g_j^0$ is covered by one group in $G_i^0$. And $\Omega$ is the set of all covered groups in the previous iterations.

Then the diffraction-signature group cover number for one clip is defined as:

$$N(C_i, \Omega) = \max_{r_i} \sum_{j \neq i} \max_{r_j} N((C_i, r_i), (C_j, r_j), \Omega)$$

If the configuration of one clip is already determined in the previous iterations, then its configuration is fixed in this computation.

After one clip with the maximal diffraction-signature group cover number is selected, the related statuses need to be updated. This is shown in step S708. The configuration of the selected clip is determined from the above computation. The selected clip is added into the selected clip set. Also, the configurations of the unselected clips are set if they are determined by the selected clip. All diffraction-signature groups which are covered by the selected clip are added into the covered group set.

The above procedures are iterated until all configurations of clips are determined and all diffraction-signature groups are covered by the selected clips.

If in step S710 it is determined that all diffraction-signature-groups are covered in the selected clip set, then the result is outputted in step S712. Otherwise, the iterative calculations continue. The output in step S712 may be selected clips with their configurations.

2. DP-SMO

The DP-SMO algorithm is a co-optimization framework for two source configurations and two mask (sub-layout) configurations used in the double patterning process flow. DP-SMO directly uses the design layout to define the cost function. This cost function does not reply on the previous split result so that it has extra flexibility in the optimized sub-layouts.

For the original design layout, a set of pre-defined evaluation points are placed along the ideal contours of the target patterns. A set of pre-defined process conditions are defined by the user which may include, for example, variations of dose, depth of defocus (DOF), mask bias etc. The cost function may be defined as a weighted summation of the high order of the estimated edge placement error (EPE) for multiple evaluation points over the process conditions. Manufacturing constraints may also be taken into account.

The optimization of the SMO is relatively complex due to the number of the constraints involved. For example, the non-linearity of the two double patterning split choices makes it much harder to achieve the global optimal for the DP-SMO. To avoid the optimizer trapped into a local minimum, two sub-layouts from a known rule-based split algorithm are used as the initialization. Also a mathematical progressive scheme is used in the SMO flow to help the optimization to converge to a global optimal solution.

3. DP Split Algorithm for Optimized Source

Given the optimized sources, the DP-split algorithm splits a larger (e.g., a full chip) design layout into two sub-layouts. The DP split step determines a significant topologic change in the design layout side. It is important to split the design layout into two sub-layouts aware of the given sources in order to expedite the overall SMO process.

Figure 8:
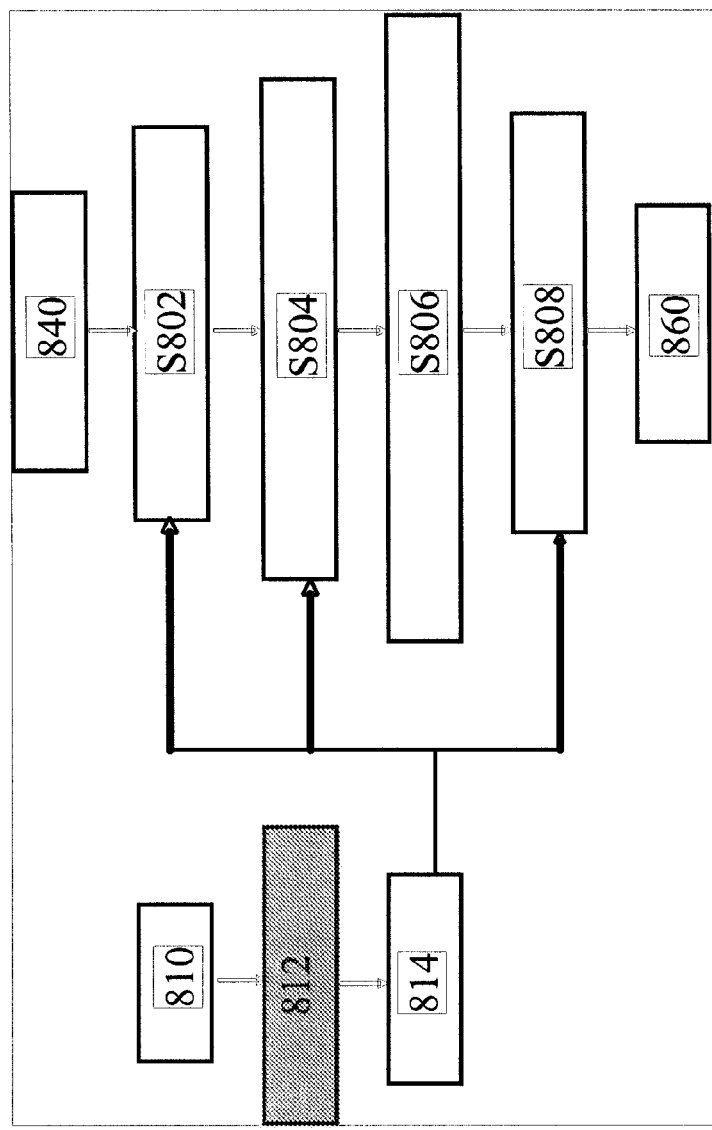
FIG. 8 shows an example flow diagram showing double patterning split algorithm for optimized source, according to an embodiment of the present invention.

As shown in the example in the FIG. 8, for a given source 810, the rule generator 812 generates a set of splitting rules 814 which are used in the DP-Split algorithm. The splitting rules encode how the split sub-layouts 860 created from a design layout 840 are preferred by the corresponding sources.

As shown in the FIG. 8, the source choice affects the splitting rules in several steps S802-S808 of the DP-split framework. In step S802, critical patterns are 'fractured.' In step S804, a graph is created listing the critical groups (may be based on diffraction signature analysis). In step S806, a global critical group graph is generated by solving the optimization problem. In step S808, the non-critical parts are also split and added to different sub-layouts. All these steps are further elaborated below.

Many of the rules used to fracture the critical part can be estimated from the source. These set of rules include, but are not limited to, the minimal pitch size, minimal corner to corner size, minimal line to end size, forbidden pitch size, etc. Given the set of rules, all polygons in the design layout are fractured into critical part and non-critical part. The critical part consists of the polygons which has critical relation (conflicts) with other critical/non-critical polygons.

The critical polygons and the conflicts between them form a graph. Then, the polygons in each connected components of the graph are grouped into a critical group. The polygons in each critical group are split into two sub-layouts, so that there is no conflict within each sub-layout. For each sub-layout in a critical group, a set of geometric features, such as pitch, corner to corner distance, etc. are measured between nearby polygons. Then a cost is calculated based on these geometric features for each source. The calculated cost is the estimation of the imaging quality of the mask under each source. Thus, for each critical group, the costs are indicative of the inter-relationship between two sub-layouts and two source configurations, and a weighted edge is added into the critical group graph from the critical group to the reference node.

An iterative method is used to split the isolated non-critical polygons based on the polygons which are already assigned into a particular sub-layout.

From all 'colored' polygons, i.e. polygons that have been identified as critical and has been assigned to a sub-layout, nearby 'uncolored' polygons are identified. A set of features is measured between the colored polygon and uncolored polygon and a cost is calculated. The cost is the estimation of the image quality, i.e., how the image would be affected if the uncolored polygon is included in the same sub-layout of the colored polygon.

The pair of the colored and uncolored polygon which has the biggest cost is chosen. In other words, it means if we assign the uncolored polygon in the same sub-layout of the colored polygon, it has the worst imaging quality. To avoid this, the uncolored polygon is assigned into a different sub-layout.

Following these steps a source-aware split algorithm can be built, which can achieve optimal image quality for the optimized source.

4. DP-OPC

After the source is optimized and full-chip design layout is split into two sub-layouts, a faster version of DP-OPC may be used to optimize the two sub-layouts simultaneously in the full-chip scale. This is an optional step to achieve more improved imaging performance.

The DP-OPC uses the similar cost function as in DP-SMO which is directly derived from the design layout. The cost function may be defined as the weighted summation of high order of the estimated edge placement error (EPE) for multiple evaluation points over various possible process conditions, and manufacture-related process constraints, if any. Usually the cost function in DP-OPC step is simpler than the cost function used in DP-SMO, and usually no progressive scheme is needed. Also, typically, fewer iteration steps are needed for the DP-OPC to converge.

5. Adding Hotspots/Warm Spots Feed Back to DP-Split and DP-Pattern Selection

As discussed before and shown in FIGS. 4 and 6, an optional LMC step can be included as part of the process flow after the DP-OPC (or DP-FMO) steps. The LMC procedure is executed to verify if there are hotspots/warm spots within the required process window. If a hotspot/warm spot is detected, the corresponding edges in the target are identified which cause the hotspot/warm-spot in the DP-OPC step. If two edges are too close to each other in the same mask, they need to be split into different masks. Thus two critical polygons are generated along the edges, and a high-priority force conflict is marked between them. Afterwards the DP-split is executed again and the two edges which cause the hotspot/warm spot are forced to be split into two different sub-layouts.

For the hotspot/warm spots which cannot be resolved by the DP-split step, they need to be fed back in the DP-pattern selection. For each hotspot/warm spot, a patch of the design layout around the hotspot/warm spot is cut out as a clip. Those new patches/clips are added into the initial large set of clips. Then the DP-pattern selection is executed again to get the new source. The new source is optimized with the new patches/clips which can achieve better imaging quality and may eliminate the hotspots/warm spots. If there are hotspots/warm spots unresolved using the new source, the design around each hotspot/warm spot may be changed to meet the limitation of the DP process.

Figure 9:
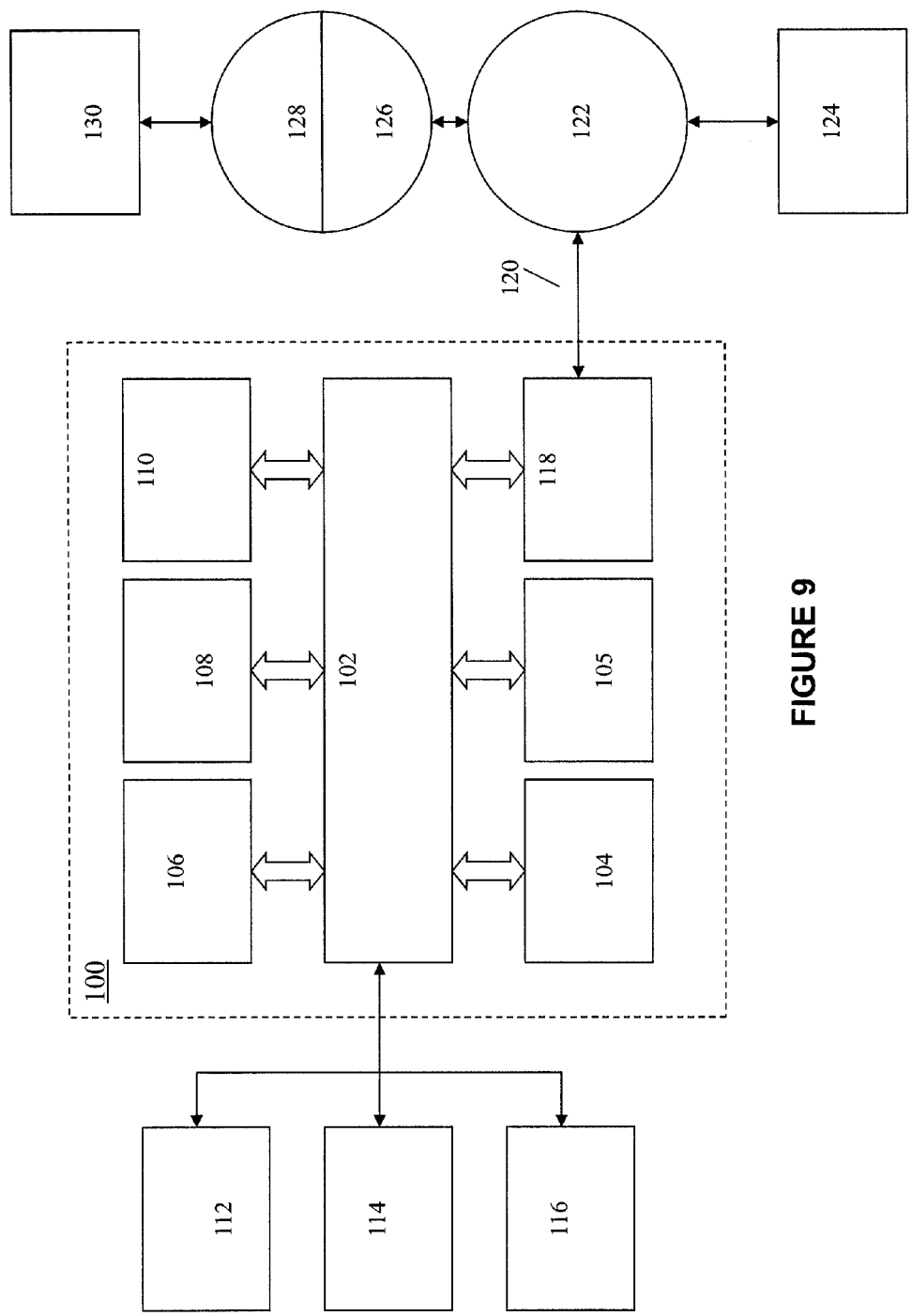
FIG. 9 is a block diagram of an example computer system in which embodiments of the invention can be implemented.

C. Details of a Computer System for Implementing the Embodiments of the Present Invention FIG. 9 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

D. Example Lithography Tool

Figure 10:
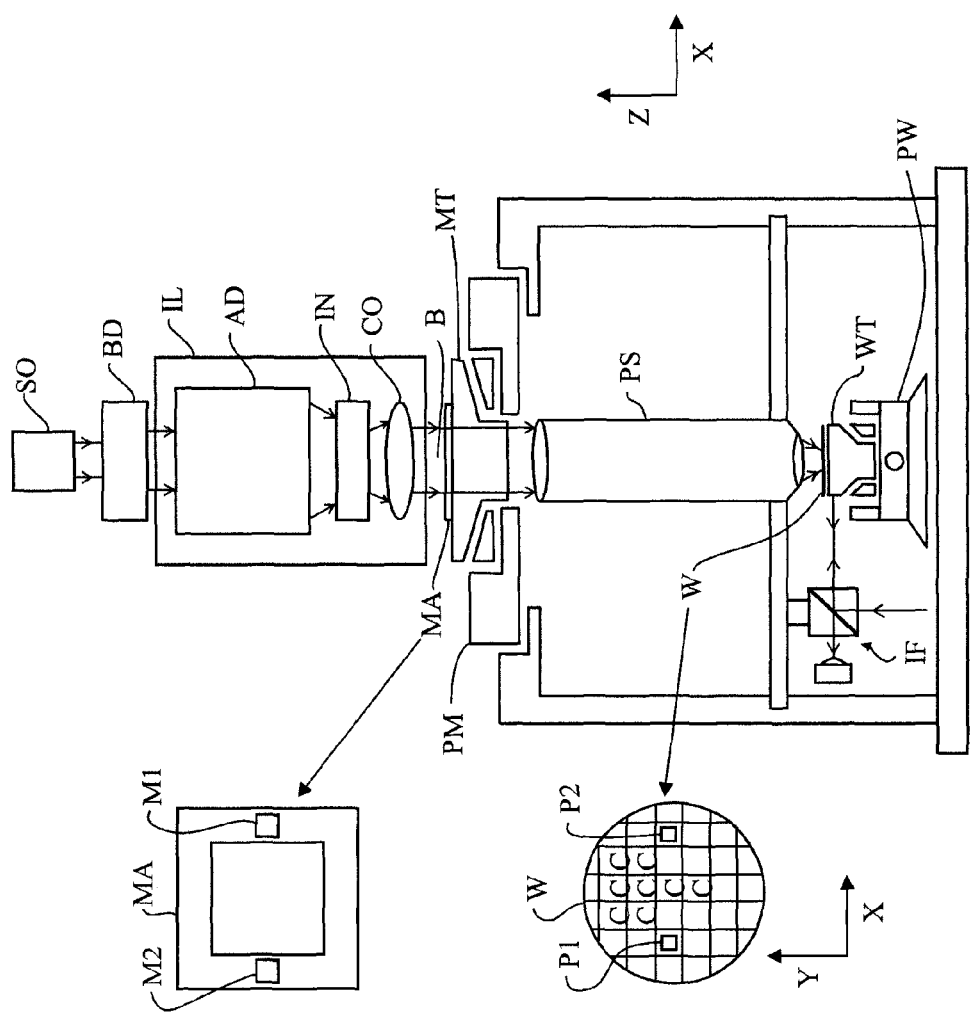
FIG. 10 is a schematic diagram of a lithographic projection apparatus to which embodiments of the invention are applicable.

FIG. 10 schematically depicts an exemplary lithographic projection apparatus whose performance could be simulated and/or optimized utilizing the computational lithography models that are calibrated using the test pattern selection process of present invention. The apparatus comprises:

a radiation system IL, for supplying a projection beam B of radiation. In this particular case, the radiation system also comprises a radiation source SO;

a first object table (mask table) MT provided with a mask holder for holding a mask MA (e.g., a reticle), and connected to first positioning means PM for accurately positioning the mask with respect to projection system PS;

a second object table (substrate table) WT provided with a substrate holder for holding a substrate W (e.g., a resist-coated silicon wafer), and connected to second positioning means PW for accurately positioning the substrate with respect to projection system PS;

a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 10. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modification.

The invention claimed is:

1. A method of splitting a pattern to be imaged onto a substrate via a lithographic process into a plurality of sub-patterns, the method comprising:
    identifying a plurality of possible split choices for splitting the pattern into the plurality of sub-patterns;
    selecting one of the identified possible split choices based on a prediction of an image of at least one sub-pattern split under each of the split choices, where the image is formed by the at least one sub-pattern after an optical setting of a lithography apparatus used in the lithographic process and the at least one sub-pattern are co-optimized, and where the image is formed by the at least one sub-pattern in a respective split choice and without regard to other sub-patterns in the same respective split choice; and
    splitting the pattern into the plurality of sub-patterns under the selected one of the possible split choices.

2. The method of claim 1, wherein selecting includes generating diffraction-maps of split layouts based on the possible split choices.

3. The method of claim 1, wherein selecting includes using diffraction-signature groups in the plurality of sub-patterns as a cost function to determine how the possible split choices affect the co-optimization.

4. The method of claim 1, further comprising optimizing the optical setting of the lithography apparatus using the at least one of the sub-patterns.

5. The method of claim 4, further comprising performing full-chip mask optimization using the optimized optical setting.

6. The method of claim 1, further comprising generating rules for the plurality of possible split choices based on a choice for the optical setting of the lithography apparatus.

7. The method of claim 6, wherein the rules include one or more of minimal pitch size, minimal corner to corner size, minimal line to end size and forbidden pitch size.

8. The method of claim 6, wherein the rules are used to fracture critical parts of the pattern.

9. The method of claim 8, wherein selecting includes creating a graph listing critical groups.

10. The method of claim 9, wherein creating the graph is based on diffraction signature analysis.

11. The method of claim 1, wherein the splitting step comprises rule-based splitting, algorithm based splitting, or a combination of rule-based and algorithm-based splitting.

12. The method of claim 1, wherein a process window of the at least one sub-pattern and a process window of the pattern match.

13. The method of claim 1, wherein the optical setting of the lithography apparatus includes one or more of: setting and characteristics of an illumination source; setting and characteristics of a projection optics system; and, combined setting and characteristics of an illumination source and a projection optics system.

14. The method of claim 1, further comprising using a pattern selection method to select a representative smaller set of portions of design layout containing the pattern from a relatively larger set, wherein the representative smaller set adequately covers characteristic pattern features of the relatively larger set.

15. The method of claim 1, further comprising using a known optical setting to generate rules for splitting the pattern, such that each of the plurality of sub-patterns contain features that are configured to be within a resolution limit of the lithography apparatus.

16. The method of claim 1, further comprising performing optical proximity correction (OPC) to further optimize the sub-patterns after optical settings are fixed as a result of the co-optimization.

17. The method of claim 16, wherein the OPC is performed for full-chip optimization.

18. The method of claim 1, wherein hot spots and warm spots are identified during a verification process that follows at least one iterative cycle of co-optimization.

19. The method of claim 18, wherein the identified hot spots and warm spots are fed back into the splitting step.

20. The method of claim 18, wherein the identified hot spots and warm spots are fed back into a pattern-selection algorithm that selects a representative smaller set of portions of design layout containing the pattern from a relatively larger set, wherein the representative smaller set adequately covers characteristic pattern features of the relatively larger set.

21. The method of claim 1, further comprising sequentially imaging the sub-patterns of the selected one of the split choices on the substrate.

* * * * *

UNITED STATES PATENT AND TRADEMARK OFFICE
CERTIFICATE OF CORRECTION

| | | |
|---|---|---|
| PATENT NO. | : 9,262,579 B2 | Page 1 of 1 |
| APPLICATION NO. | : 14/468635 | |
| DATED | : February 16, 2016 | |
| INVENTOR(S) | : Luoqi Chen et al. | |

It is certified that error appears in the above-identified patent and that said Letters Patent is hereby corrected as shown below:

On Title Page, Related U.S. Application Data, Item (63), Line 1
    replace "13/349,692"
    with --13/439,692--.

Signed and Sealed this
Twenty-first Day of June, 2016

Michelle K. Lee
*Director of the United States Patent and Trademark Office*